(12) United States Patent
Hanafusa

(10) Patent No.: US 8,096,861 B2
(45) Date of Patent: Jan. 17, 2012

(54) HOUSING APPARATUS FOR HEAT GENERATING DEVICE

(75) Inventor: Koichiro Hanafusa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 110 days.

(21) Appl. No.: 11/711,039

(22) Filed: Feb. 27, 2007

(65) Prior Publication Data

US 2007/0211429 A1    Sep. 13, 2007

(30) Foreign Application Priority Data

Mar. 9, 2006  (JP) ................................ 2006-064792

(51) Int. Cl.
*H05K 5/00* (2006.01)
*H05K 7/20* (2006.01)
*A47F 3/04* (2006.01)

(52) U.S. Cl. ......... 454/184; 312/236; 361/695; 361/696

(58) Field of Classification Search .......... 454/184–185, 454/195; 312/236; 361/695–696
See application file for complete search history.

(56) References Cited

U.S. PATENT DOCUMENTS

| | | | | |
|---|---|---|---|---|
| 3,120,166 A | * | 2/1964 | Lyman ........................... | 454/307 |
| 3,210,456 A | * | 10/1965 | Skubal .......................... | 174/16.1 |
| 4,644,095 A | * | 2/1987 | Bright et al. ................... | 174/50 |
| 4,665,654 A | * | 5/1987 | Stedron et al. ................. | 49/484.1 |
| 4,753,496 A | * | 6/1988 | Bussard ......................... | 312/236 |
| 5,150,277 A | * | 9/1992 | Bainbridge et al. ........... | 361/695 |
| 5,428,503 A | * | 6/1995 | Matsushima et al. .......... | 361/695 |
| 5,460,441 A | * | 10/1995 | Hastings et al. ............... | 312/298 |
| 5,467,250 A | * | 11/1995 | Howard et al. ................ | 361/696 |
| 5,544,012 A | * | 8/1996 | Koike ............................ | 361/695 |
| 5,608,609 A | * | 3/1997 | Morrell ......................... | 361/690 |
| 5,798,485 A | * | 8/1998 | Rohde et al. ................... | 174/383 |
| 5,851,143 A | * | 12/1998 | Hamid ............................ | 454/57 |
| 5,949,646 A | * | 9/1999 | Lee et al. ....................... | 361/695 |

(Continued)

FOREIGN PATENT DOCUMENTS

CN    1392768 A    1/2003

(Continued)

OTHER PUBLICATIONS

"Notification of the First Office Action" mailed by the Chinese Patent Office on Jun. 5, 2009, for Chinese Patent Application No. 200710084469.8.

(Continued)

*Primary Examiner* — Steven B McAllister
*Assistant Examiner* — Helena Kosanovic
(74) *Attorney, Agent, or Firm* — Finnegan, Henderson, Farabow, Garrett & Dunner, L.L.P.

(57) ABSTRACT

According to one embodiment, a housing apparatus for a heat generating device includes a housing being provided with sidewalls arranged sideward to separate from each other, and shelf members placed at a plurality of positions along the sidewalls between the sidewalls. The shelf members support a plurality of devices including a heat generating device, and each sidewall has a plurality of ventilation openings corresponding to the devices held by the shelf members. A duct member is provided on at least outermost sidewall to correspond to at least two adjacent ventilation openings in the outermost sidewall. An airflow producing unit is provided in the duct member and includes at least two airflow producing devices performing one of supplying outside air into the inside of the housing and evacuating the inside air from the housing through the at least two adjacent ventilation openings.

6 Claims, 5 Drawing Sheets

U.S. PATENT DOCUMENTS

| | | | |
|---|---|---|---|
| 6,088,225 A * | 7/2000 | Parry et al. | 361/704 |
| 6,104,003 A * | 8/2000 | Jones | 219/400 |
| 6,164,369 A * | 12/2000 | Stoller | 165/104.33 |
| 6,186,890 B1 * | 2/2001 | French et al. | 454/184 |
| 6,198,628 B1 * | 3/2001 | Smith | 361/695 |
| 6,294,762 B1 * | 9/2001 | Faries et al. | 219/400 |
| 6,309,296 B1 * | 10/2001 | Schwenk et al. | 454/184 |
| 6,351,381 B1 | 2/2002 | Bilski et al. | |
| 6,554,697 B1 * | 4/2003 | Koplin | 454/184 |
| 6,603,660 B1 * | 8/2003 | Ehn et al. | 361/694 |
| 6,652,374 B2 * | 11/2003 | Sharp et al. | 454/184 |
| 6,657,861 B2 * | 12/2003 | Irmer | 361/695 |
| 6,742,583 B2 * | 6/2004 | Tikka | 165/291 |
| 6,788,535 B2 * | 9/2004 | Dodgen et al. | 361/695 |
| 6,807,056 B2 * | 10/2004 | Kondo et al. | 361/689 |
| 6,833,991 B2 * | 12/2004 | Van Gaal | 361/690 |
| 6,847,013 B2 * | 1/2005 | Audette et al. | 219/400 |
| 2003/0124970 A1 * | 7/2003 | Webster et al. | 454/184 |
| 2006/0256541 A1 * | 11/2006 | Sandgren et al. | 361/796 |

FOREIGN PATENT DOCUMENTS

| | | |
|---|---|---|
| JP | 10-13071 | 1/1998 |
| JP | 2001-094281 | 4/2001 |
| JP | 2001-244676 | 9/2001 |
| JP | 2002-026572 | 1/2002 |
| JP | 2004-179518 | 6/2004 |
| JP | 2004-363236 | 12/2004 |
| JP | 2005-072960 | 3/2005 |
| WO | WO 03/001861 A1 | 1/2003 |

OTHER PUBLICATIONS

"Notification of Reasons for Rejection" mailed by the Japanese Patent Office on Sep. 24, 2008 for Japanese Patent Application No. 2006-064792.

* cited by examiner

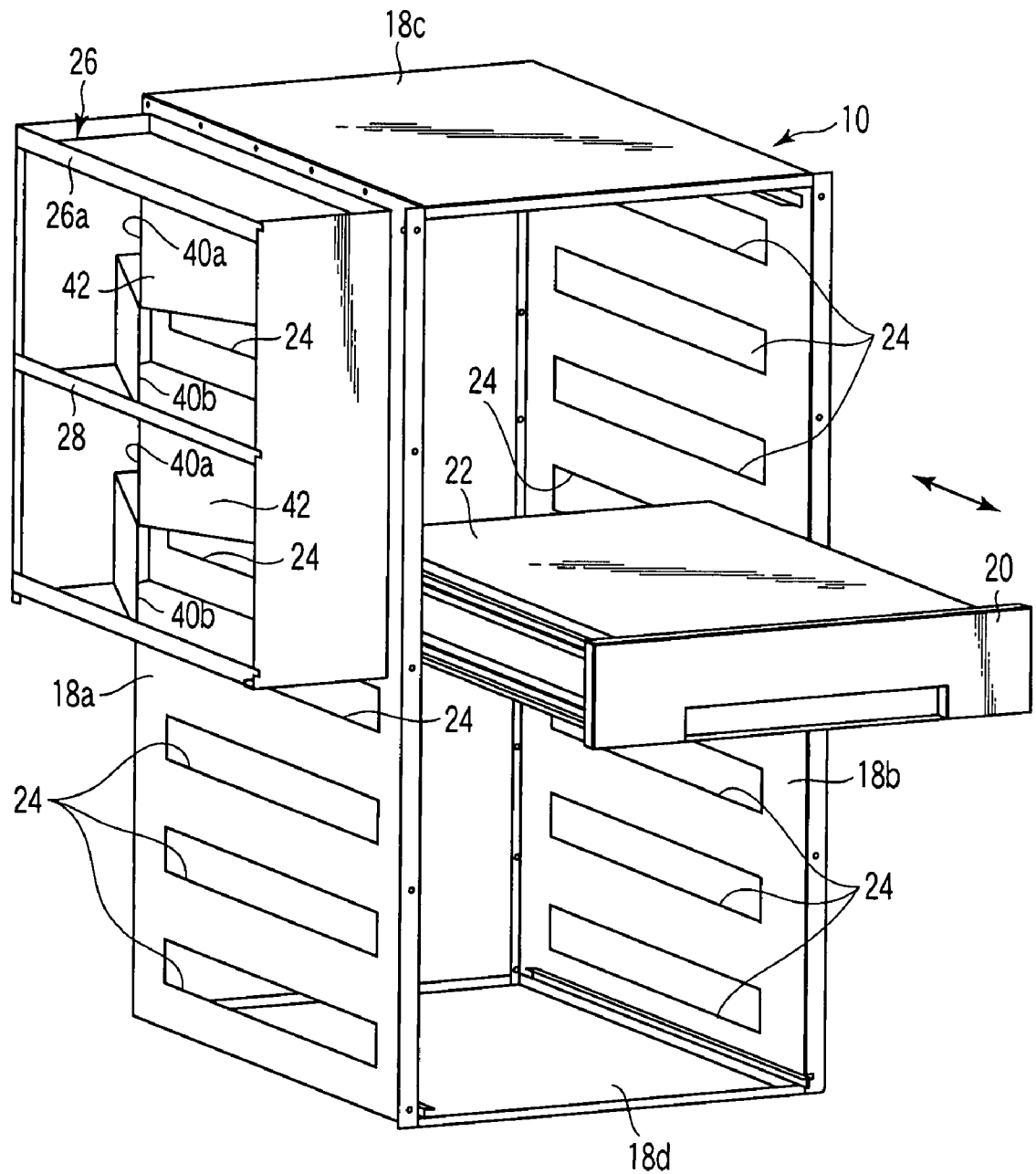
F I G. 3

US 8,096,861 B2

HOUSING APPARATUS FOR HEAT GENERATING DEVICE

CROSS-REFERENCE TO RELATED APPLICATIONS

This application is based upon and claims the benefit of priority from prior Japanese Patent Application No. 2006-064792, filed Mar. 9, 2006, the entire contents of which are incorporated herein by reference.

BACKGROUND OF THE INVENTION

1. Field of the Invention

One embodiment of this invention relates to a housing apparatus for a heat generating device.

2. Description of the Related Art

Various heat generating devices such as an amplifier are used in a field of electrical communication. These heat generating devices including the amplifier are arranged to separate from each other in a housing apparatus. A plurality of ventilation openings is formed in the housing apparatus, and a blower and/or an evacuating device are or is provided in the housing apparatus.

The blower supplies outside air into the housing apparatus, and forces air heated by the heat generating devices in the housing apparatus to the outside through the ventilation openings. The evacuating device evacuates air heated by the heat generating devices in the housing apparatus to the outside through the ventilation openings.

Such a conventional housing apparatus for a heat generating device as described above has been well known by Jpn. Pat. Appln. KOKAI Publication Nos. 2004-179518 and 10-13071, for example.

The Jpn. Pat. Appln. KOKAI Publication No. 2004-179518 discloses a housing apparatus in which substrates including a heating circuit are housed in stand up positions to be separated from each other. An upper end of the housing apparatus is opened upward, and the upper end opening of the housing apparatus is covered by a cover provided with an evacuating fan.

The Jpn. Pat. Appln. KOKAI Publication No. 10-13071 discloses a housing apparatus including a pair of sidewalls and a plurality of shelves arranged between the sidewalls to be separated from each other in the vertical direction. Various devices including a heat generating device are placed on the shelves. Ventilation openings are formed in each sidewall at a plurality of positions corresponding to the devices placed on the shelves. A blower fan is arranged on the outside of one sidewall and supplies outside air into the housing apparatus through the ventilation openings of the one sidewall. The ventilation openings can be selectively closed by a shield plate, so that the only ventilation openings corresponding to the heat generating device which especially needs cooling have been opened.

BRIEF SUMMARY OF THE INVENTION

According to one embodiment, a housing apparatus for a heat generating device includes a housing including a plurality of sidewalls arranged sideward to separate from each other, and a plurality of shelf members placed at a plurality of positions along the sidewalls between the sidewalls. The shelf members support a plurality of devices including a heat generating device, and each sidewall has a plurality of ventilation openings corresponding to the devices held by the shelf members. A duct member is provided on at least one outermost sidewall of the sidewalls of the housing and corresponds to at least two adjacent ventilation openings of the ventilation openings in the at least one outermost sidewall. The duct member includes an airflow guide plate providing at least two airflow guide paths corresponding to the at least two ventilation openings. An airflow producing unit is provided in the duct member. The airflow producing unit includes at least two airflow producing devices performing one of supplying outside air into the inside of the housing and evacuating the inside air from the housing through the at least two adjacent ventilation openings corresponding thereto. The at least two airflow producing devices of the airflow producing unit are arranged so that one of the at least two airflow producing devices is in front of the other along the at least one outermost sidewall. Each airflow producing device faces the at least two adjacent ventilation openings corresponding thereto. The at least two airflow producing devices perform one of supplying outside air to the inside of the housing and evacuating the inside air from the housing through the at least two airflow guide oaths.

BRIEF DESCRIPTION OF THE SEVERAL VIEWS OF THE DRAWINGS

The accompanying drawings, which are incorporated in and constitute a part of the specification, illustrate a presently embodiment of the invention, and together with the general description given above and the detailed description of the embodiment given below, serve to explain the principles of the invention.

FIG. 3 is an exemplary perspective view showing a main framework of a housing of the housing apparatus for a heat generating device of FIG. 1, together with a duct member for attaching a fan unit fixed to the framework;

DETAILED DESCRIPTION OF THE INVENTION

A housing apparatus for a heat generating device according to an embodiment of the invention will be explained in detail hereinafter with reference to the accompanying drawings.

The housing apparatus for a heat generating device according to the embodiment of the invention houses devices which provides a transmitter of a communication device and which includes a heat generating device represented by an amplifier.

Figure 1:
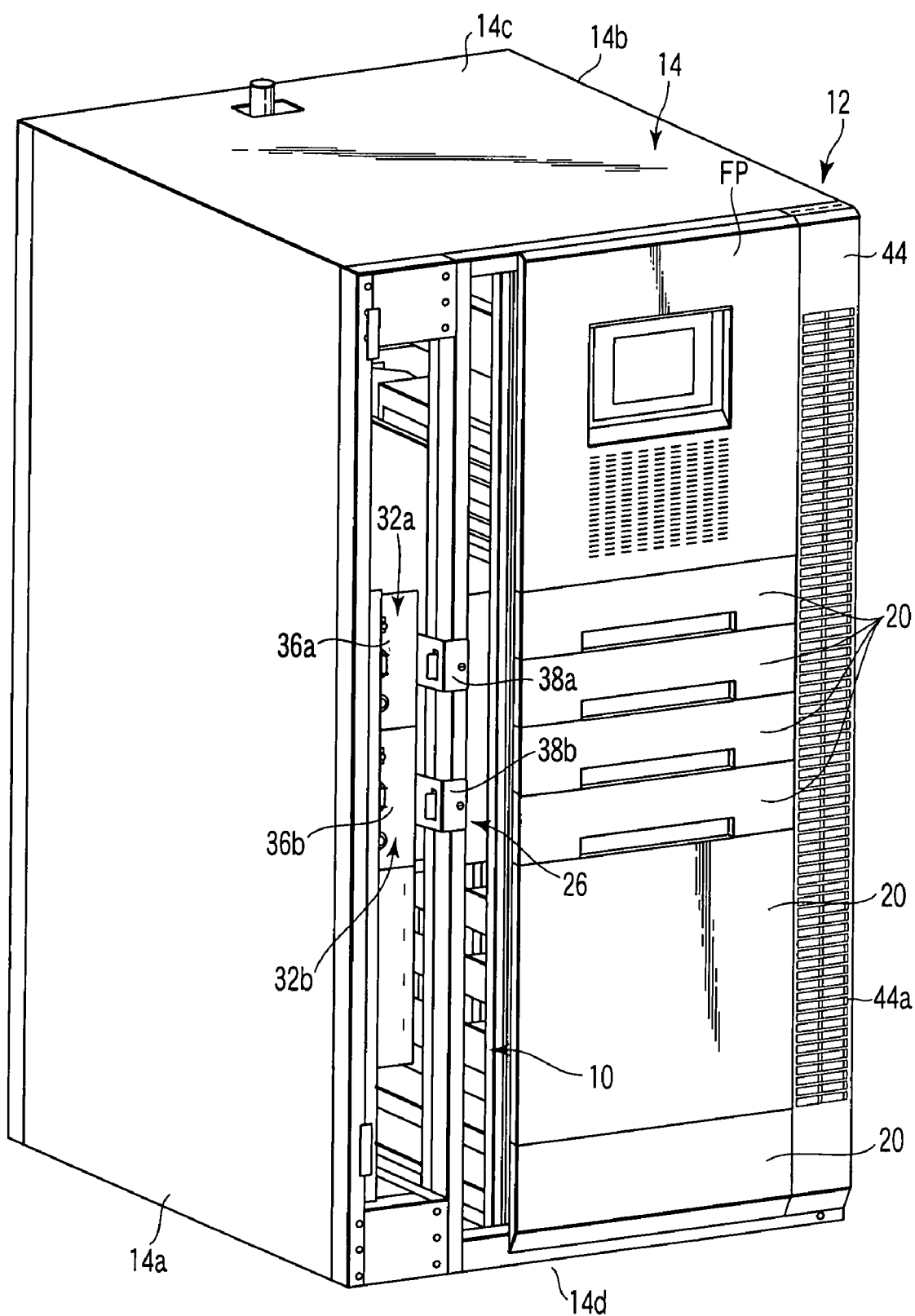
FIG. 1 is an exemplary perspective view showing a front side of a housing apparatus for a heat generating device according to an embodiment of this invention.
Figure 2:
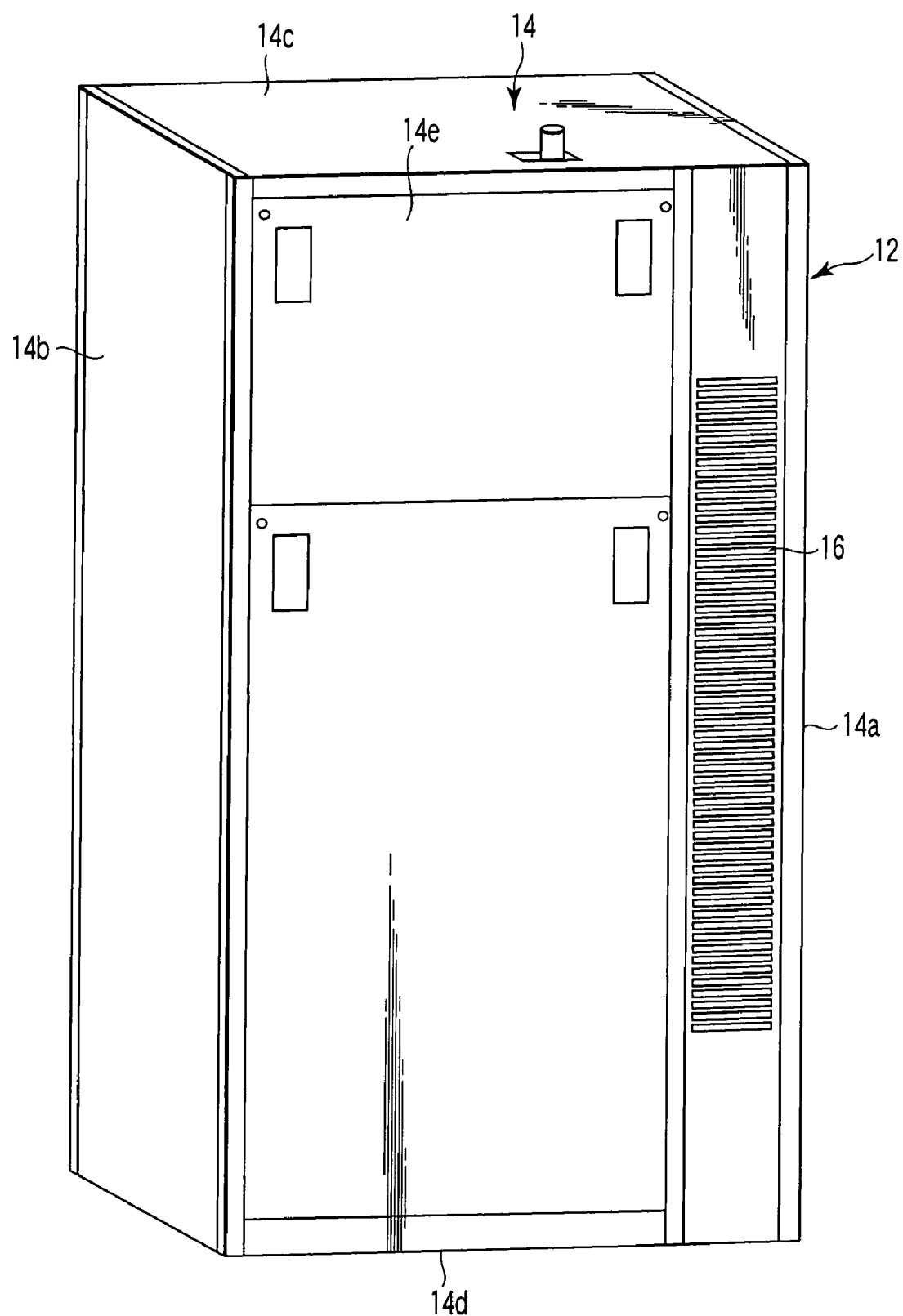
FIG. 2 is an exemplary perspective view showing a rear side of the housing apparatus for a heat generating device of FIG. 1.

The housing apparatus for a heat generating device has a housing 12 including a framework 10, as shown in FIG. 1 and FIG. 2. The housing 12 includes a rectangular outer case 14 surrounding the framework 10 and elongated in the vertical direction.

The outer case 14 includes a pair of vertically elongated rectangular outside panels 14a and 14b placed parallel to each other and spaced sideward from each other, a top panel 14c covering a square upper opening between the pair of outside panels 14a and 14b, a bottom panel 14d covering a square lower opening between the pair of outside panels 14a and 14b, and a rear panel 14e covering a vertically elongated rectangular rear opening between the pair of outside panels 14a and 14b. The rear panel 14e is divided into a plurality of sections to facilitate maintenance of devices, members, etc. housed in the outer case 14. And, a number of ventilation openings 16 are formed in a vertical section which is positioned on the right side when the outer case 14 is viewed from the rear, and which extends along the outside panel 14a between the top panel 14c and bottom panel 14d.

The framework 10 includes a pair of sidewalls 18a and 18b placed parallel to each other and spaced sideward from each other, as shown in detail in FIG. 3. The upper ends of the sidewalls 18a and 18b are connected by an upper support member 18c. The upper support member 18c covers the upper square opening between the sidewalls 18a and 18b. The lower ends of the sidewalls 18a and 18b are connected by a lower support member 18d. The lower support member 18d covers the lower square opening between the sidewalls 18a and 18b.

A plurality of shelf members 20 are removably provided at a plurality of positions along the sidewalls 18a and 18b in a space surrounded by the sidewalls 18a and 18b and the upper and lower support members 18c and 18d. In this embodiment, each shelf member 20 is held by not-shown and well known guide rails to be movable in back and forth directions relative to the sidewalls 18a and 18b between a retracted position and a forward projected position, at the retracted position each shelf member 20 locating between sidewalls 18a and 18b, and at the forward projected position each shelf member 20 projecting forward from the sidewalls 18a and 18b. Each shelf member 20 can be selectively fixed at the retracted position by a not-shown fixing device.

Various devices 22 providing a transmitter of a communication device and including a heat generating device such as an amplifier are mounted on the shelf members 20, and removably fixed by not-shown and well known removable fixing means.

A plurality of ventilation openings 24 are formed in each of the sidewalls 18a and 18b to corresponding to the devices 22 supported by the shelf members 20. A duct member 26 having a rectangular cross section is provided on one of the sidewalls 18a and 18b to correspond to at least two, four in this embodiment, adjacent ventilating openings among the ventilating openings 24. The duct member 26 has one end in which one opening facing one sidewall 18a is formed and the other end in which the other opening opposing to the sidewall 18a is formed. The inner space of the duct member 26 is divided by a partition wall 28 into two chambers each of which corresponding to two adjacent ventilation openings 24.

The shelf members 20 corresponding to the four ventilation openings 24 corresponding to the duct member 27 supports the devices that produce a large amount of heat, for example an amplifier.

Figure 4:
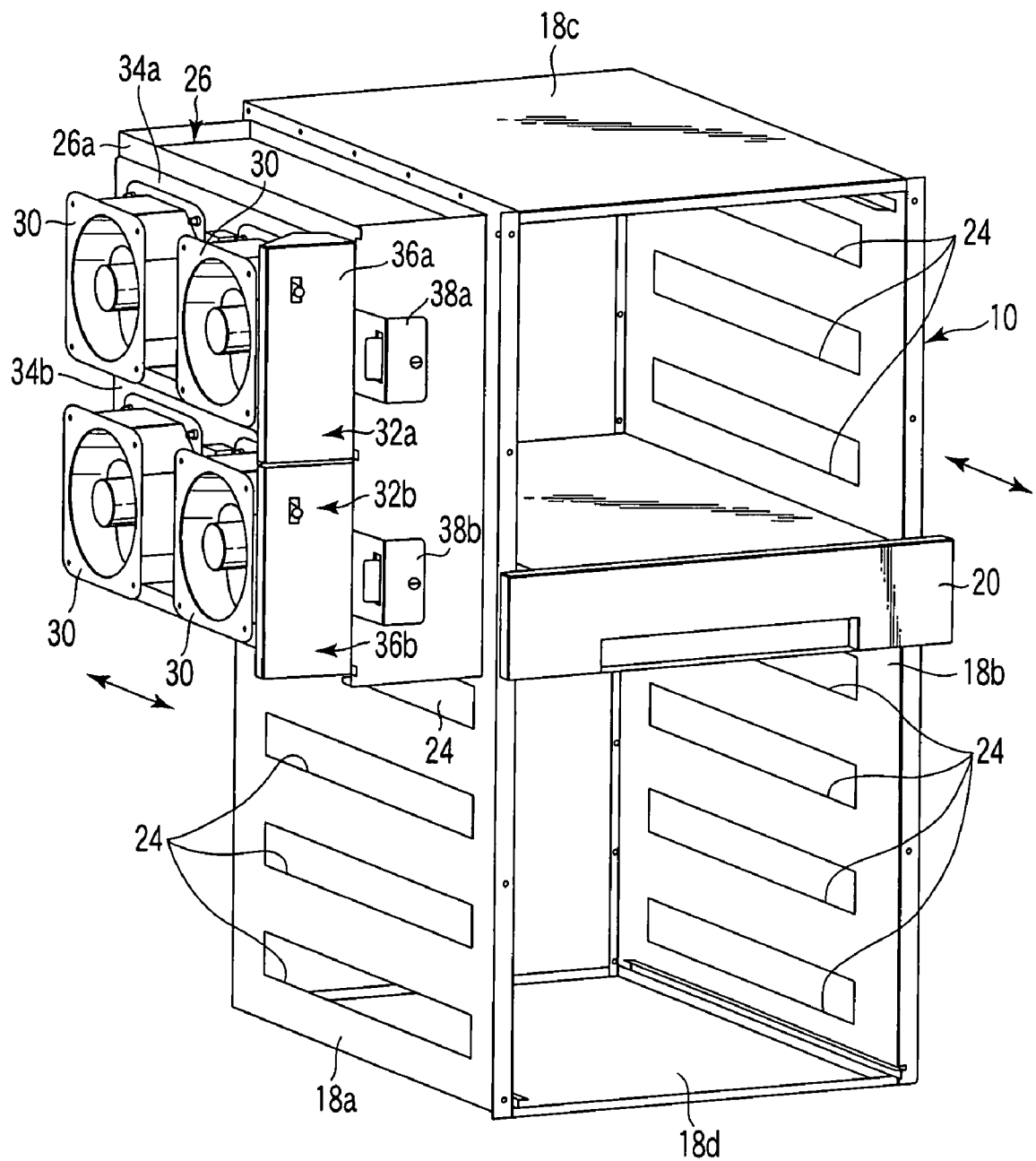
FIG. 4 is an exemplary perspective view showing the framework of FIG. 3, in a state that a fan unit is attached to the duct member for attaching a fan unit.

As shown in detail in FIG. 4, at least two, four in this embodiment, airflow producing devices 30 are provided on the other end of the duct member 26 to correspond to at least two, four in this embodiment, ventilation openings 24 to which the duct member 26 corresponds.

Four airflow producing devices 30 are classified into one airflow producing unit 32a including two devices 30 corresponding to one chamber of the duct member 26, and the other airflow producing unit 32b including two remaining devices 30 corresponding to the other chamber of the duct member 26.

Two airflow producing devices 30 of the one airflow producing unit 32a are arranged in the back and forth directions of the corresponding sidewall 18a, and are supported by a common support panel 34a. The support panel 34a is held by a not-shown and well known guide rail provided at the outer end of the upper wall 26a of the duct member 26 to be movable in the back and forth direction between a retracted position and a projecting forward position. At the retracted position the support panel 34a is located on the side of the outer end of the upper wall 26a, and at the projecting forward position the support panel 34a projects forward from the side of the outer end of the upper wall 26a.

Two airflow producing devices 30 of the other airflow producing unit 32b are also arranged in the back and forth directions of the corresponding sidewall 18a, and are supported by the other common support panel 34b. The other support panel 34b is held by a not-shown and well known guide rail provided at the outer end of the partition wall 28 of the duct member 26 to be movable in the back and forth direction between a retracted position and a projecting forward position. At the retracted position the other support panel 34b is located on the side of the outer end of the partition wall 28, and at the projecting forward position the other support panel 34b projects forward from the side of the outer end of the partition wall 28.

In this embodiment, each of the airflow producing devices 30 includes an axial fan.

The support panels 34a and 34b include front covers 36a and 36b, each of which is arranged at forward of the front and rear airflow producing devices 30, and grips 38a and 38b projecting forward from the front covers 36a and 36b.

The duct member 26 further includes two airflow guide plates 42 arranged in two chambers. Each airflow guide plate 42 provides two airflow guide paths 40a and 40b, each corresponding to two ventilation openings in each of two chambers. In each chamber, the outer ends of two airflow guide paths 40a and 40b are opened toward two airflow producing devices 30 corresponding to each chamber of the duct member 26. Also, in each chamber, the inner ends of two airflow guide paths 40a and 40b are opened toward two ventilation openings 24 corresponding to each chamber of the duct member 26.

When the framework 10 provided with the duct member 26 and two airflow producing units 32a and 32b as shown in FIG. 4 is housed at a predetermined position in the inner space of the outer case 14, the front panels of the shelf members 20 placed at the retracted positions cover the most of the middle part of the front opening of the outer case 14 as shown in FIG. 1, and two side spaces are produced between the pair of sidewalls 18a and 18b of the framework 10 and the pair of outside panels 14a and 14b of the outer case 14.

In this embodiment, other various devices related to the devices supported by the shelf members 20 of the framework 10 are housed in the upper end portion of the middle part of the inner space in the outer case 14, and a front panel FP for the other devices covers the remainder of the middle part of the front opening of the outer case 14.

The duct member 26 provided with two airflow producing units 32a and 32b placed at the retracted positions is located in one side space area between one sidewall 18a of the framework 10 and one outside panel 14a of the outer case 14. The front opening of the one side space area is covered with a not-shown first open/close cover attached to the front end of the one outside panel 14a to be able to open.

In the other side space area between the other sidewall 18a of the framework 10 and the other outside panel 14b of the outer case 14, nothing exists. The front opening of the other side space area is covered with a not-shown second open/close cover 44 attached to the front end of the other outside panel 14b to be able to open. The second open/close cover 44 is formed with a number of ventilation openings 44a.

When a not-shown main switch of the transmitter is turned on, two airflow producing devices 30 of each of two airflow producing units 32a and 32b are also turned on. As a result, a current of air is produced in the inner space of the outer case 14 of the housing 12 from the ventilation openings 44a of the second open/close cover 44 to the ventilation openings of the right side vertical section of the rear panel 14e of the outer case 14, through the side space area between the other sidewall 18b of the framework 10 and the other outside panel 14b of the outer case 14, the ventilation openings 24 of the other sidewall 18b of the framework 10, the ventilation openings 24 of the one sidewall 18a (particularly, the four ventilation openings 24 corresponding to the four airflow producing devices 30 of the two airflow producing units 32a and 32b corresponding to the two upper and lower chambers of the duct member 26), the side space area between the one sidewall 18a of the framework 10 and the one outside panel 14a of the outer case 14.

This current of air in the inner space of the outer case 14 is strong in the four ventilation openings 24 corresponding to the four airflow producing devices 30 of the two airflow producing units 32a and 32b corresponding to the two upper and lower chambers of the duct member 26, and can efficiently discharge the heat generated by the heat generating devices including the amplifier and held by the four shelf members 20 corresponding to the four ventilation openings 24, to the outside space through the ventilation openings 16 of the right side vertical section of the rear panel 14e of the outer case 14.

Moreover, since two airflow producing devices 30 arranged in the back and forth direction are assigned to the two ventilation openings 24 corresponding to the two adjacent shelf members 20 in the sidewall 18a of the framework 10, even if one of two airflow producing devices 30 fails and stops, the other airflow producing device 30 can forcibly suck air through the two ventilation openings 24. Therefore, the heat generated by the heat generating devices including an amplifier and supported by the two shelf members 20 corresponding to these two ventilating openings 24 can be efficiently discharged to the outside space through the ventilation openings 16 of the right side vertical section of the rear panel 14e of the outer case 14.

In addition, since the size of each airflow producing device 30 corresponds to the two ventilation openings 24 corresponding to the two adjacent shelf members 20, its airflow producing capacity is large. Namely, its heat discharging capacity is high. Further, since these two airflow producing devices 30, each having the above described size, are arranged in the back and forth direction to the corresponding two ventilation openings 24, the height of the framework 10 can be compact.

For the maintenance of the two airflow producing devices 30 of each of the airflow producing units 32a and 32b, the not-shown first open/close cover covering the two airflow producing units 32a and 32b in the front opening of the outer case 14 of the housing 12 is opened to expose the grips 38a and 38b of the airflow producing units 32a and 32b, as shown in FIG. 1.

Figure 5:
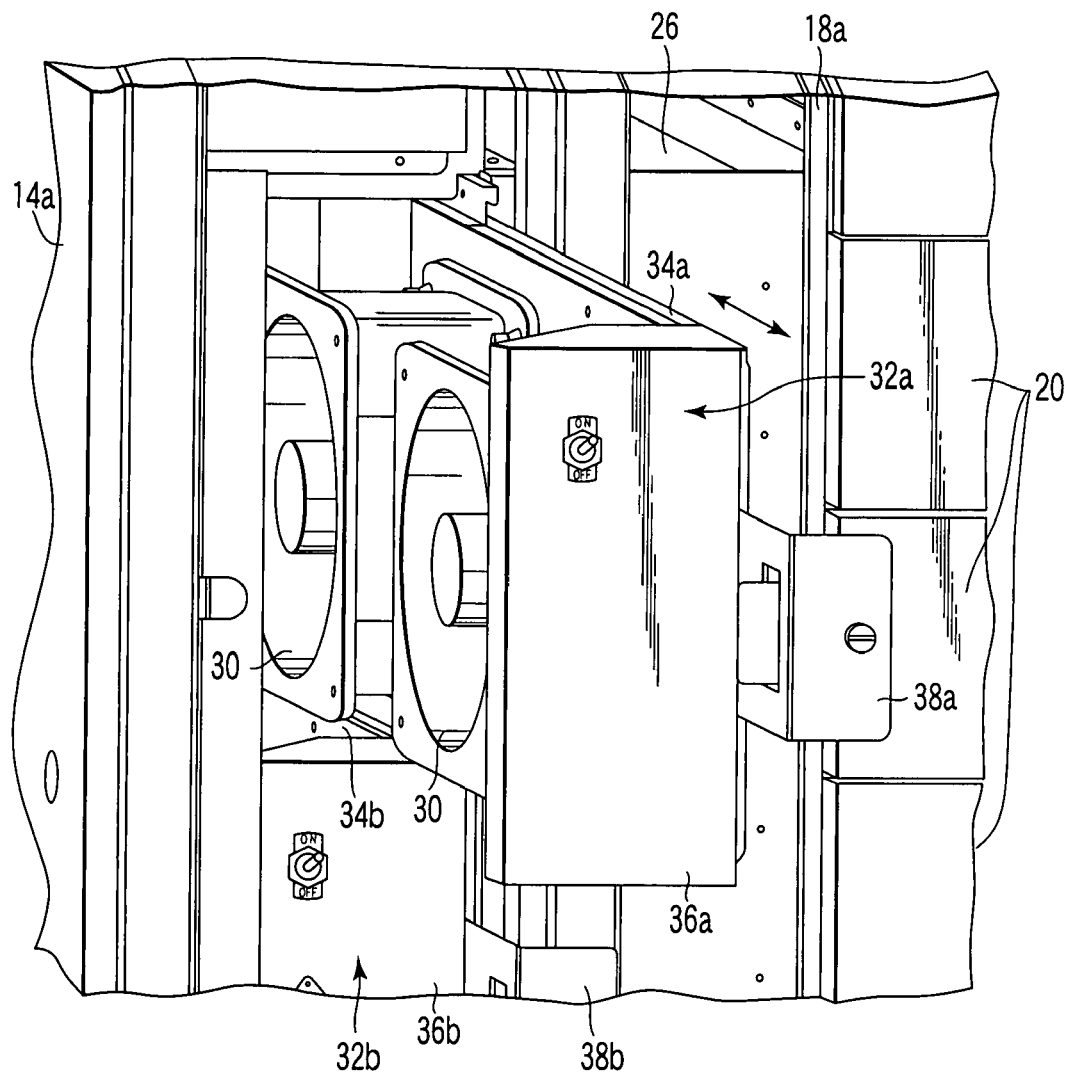
FIG. 5 is an exemplary enlarged perspective view showing the fan unit and its surroundings of FIG. 4.
Figure 6:
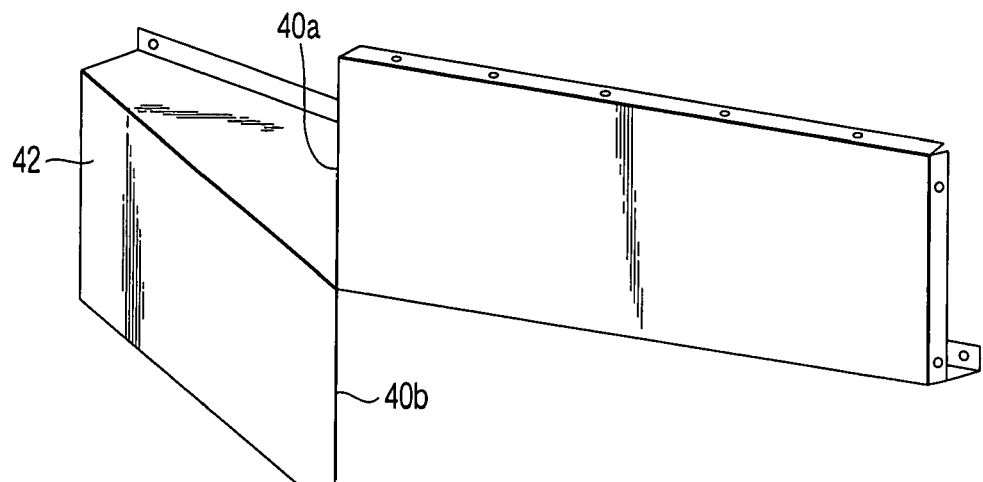
FIG. 6 is an exemplary perspective view of an air guide plate provided in the duct member of FIG. 3.

Then, the grips 38a and 38b are pulled, so that the airflow producing units 32a and 32b are moved from the retracted position shown in FIG. 1 to the projecting forward position shown in FIG. 5 with respect to the duct member 26. This facilitates the maintenance of the two airflow producing devices 30 of each of the airflow producing units 32a and 32b.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A housing apparatus for a heat generating device, comprising:
    a housing which has a height, a width, and a depth, and which includes a plurality of sidewalls arranged in a lateral direction along the width to separate from each other, and a plurality of shelf members placed at a plurality of positions along the sidewalls between the sidewalls to support a plurality of devices including at least one heat generating device, the plurality of positions being arranged in a height direction along the height, and each sidewall having a plurality of ventilation openings arranged in the height direction to correspond to the devices held by the shelf members;
    a duct member which is provided on at least one outermost sidewall of the sidewalls of the housing, and which corresponds to at least two ventilation openings located adjacent to each other in the height direction in the at least one outermost sidewall, the duct member including an airflow guide plate providing at least two adjacent airflow guide paths corresponding to the at least two adjacent ventilation openings, the at least two adjacent airflow guide paths communicating with the at least two adjacent ventilation openings respectively; and
    an airflow producing unit which is provided on the duct member and which includes at least two airflow producing devices performing one of supplying outside air into the inside of the housing and evacuating the inside air from the housing through the at least two adjacent ventilation openings corresponding thereto;
    wherein the at least two airflow producing devices of the airflow producing unit are arranged in the back and forth direction;
    each of the at least two airflow producing devices arranged in the back and forth direction faces the at least two adjacent ventilation openings located adjacent to each other in the height direction and corresponding to the at least two airflow producing devices through the duct member, the airflow guide plate being located between the at least two airflow producing devices and the at least two adjacent ventilation openings located adjacent to each other in the height direction; and
    each airflow producing device performs one of supplying outside air to the inside of the housing and evacuating the inside air from the housing, through each airflow guide path corresponding to the respective airflow producing device and through each of the at least two adjacent ventilation openings corresponding to the respective airflow producing device wherein when evacuating the inside air from the housing, the outlets of the at least two adjacent airflow guide paths are arranged in a back and forth direction along the depth.

2. The housing apparatus for a heat generating device according to claim 1, wherein the airflow producing device includes an axial fan.

3. The housing apparatus for a heat generating device according to claim 1, wherein the heat generating device includes an amplifier, and the devices including the heat generating device provide a transmitter of a communication device.

4. The housing apparatus for a heat generating device according to claim 1, wherein:
the ventilation openings in the at least one outermost sidewall provide plural combinations each of which includes the at least two adjacent ventilation openings, and
the duct member provided with the airflow producing unit including the at least two airflow producing devices is provided on the at least one outermost sidewall of the sidewalls of the housing to correspond to each combination of the at least two adjacent ventilation openings.

5. The housing apparatus for a heat generating device according to claim 1, wherein the number of the ventilation openings corresponding to the duct member in the outermost sidewall of the housing, the number of the airflow producing devices provided in the duct member, and the number of the airflow guide paths provided by the airflow guide plate included in the duct member are equal.

6. The housing apparatus for a heat generating device according to claim 1, wherein one of the ventilation openings is formed at each of the plurality of positions in the height direction in the at least one outermost sidewall of the housing, each ventilation opening is long and narrow in the back and forth direction, and each airflow producing device faces one of a forward half and a back half of each ventilation opening corresponding to the respective airflow producing device.

* * * * *